United States Patent
Weng

(10) Patent No.: US 6,836,525 B1
(45) Date of Patent: Dec. 28, 2004

(54) METHOD FOR ESTABLISHING A GRAY CODE AND RELATED COUNTER CIRCUIT

(75) Inventor: Chi-Shun Weng, Tainan Hsien (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/605,614

(22) Filed: Oct. 14, 2003

(30) Foreign Application Priority Data

Jul. 21, 2003 (TW) .................................. 92119873 A

(51) Int. Cl.$^7$ ............................................. H03K 21/00
(52) U.S. Cl. ...................................................... 377/34
(58) Field of Search ............................................ 377/34

(56) References Cited

U.S. PATENT DOCUMENTS

| | | | |
|---|---|---|---|
| 5,097,491 A | | 3/1992 Hall ............................ 377/34 |
| 6,703,950 B2 | * | 3/2004 Yi ............................... 341/97 |

\* cited by examiner

*Primary Examiner*—Margaret R. Wambach
(74) *Attorney, Agent, or Firm*—Winston Hsu

(57) ABSTRACT

A method for establishing a Gray code count sequence having N code words includes determining a first bit switch sequence having $2^M-1$ elements and a bit switching sequence property according to a first Gray code count sequence having $2^M$ code words and where $2^M$ is larger than N. A second bit switch sequence is determined having N-1 elements and the bit switching sequence property according to the first bit switch sequence. A second Gray code count sequence is determined according to the second bit switch sequence.

20 Claims, 8 Drawing Sheets

| Decimal numbers | Binary Gray code | Bit switch sequence |
|---|---|---|
| 0 | 0 0 0 0 | |
| 1 | 0 1 0 0 | 3 |
| 2 | 0 1 0 1 | 1 |
| 3 | 0 1 1 1 | 2 |
| 4 | 0 1 1 0 | 1 |
| 5 | 1 1 1 0 | 4 |
| 6 | 1 1 1 1 | 1 |
| 7 | 1 1 0 1 | 2 |
| 8 | 1 1 0 0 | 1 |
| 9 | 1 0 0 0 | 3 |
| 10 | 1 0 0 1 | 1 |

| Decimal numbers | Binary Gray code | Bit switch sequence |
|---|---|---|
| 0 | 0 0 0 0 | |
| 1 | 0 0 0 1 | 1 |
| 2 | 0 0 1 1 | 2 |
| 3 | 0 0 1 0 | 1 |
| 4 | 0 1 1 0 | 3 |
| 5 | 0 1 1 1 | 1 |
| 6 | 0 1 0 1 | 2 |
| 7 | 0 1 0 0 | 1 |
| 8 | 1 1 0 0 | 4 |
| 9 | 1 1 0 1 | 1 |
| 10 | 1 1 1 1 | 2 |
| 11 | 1 1 1 0 | 1 |
| 12 | 1 0 1 0 | 3 |
| 13 | 1 0 1 1 | 1 |
| 14 | 1 0 0 1 | 2 |
| 15 | 1 0 0 0 | 1 |

Fig. 1 Prior Art

| Decimal numbers | Binary Gray code | Bit switch sequence |
|---|---|---|
| 0 | 0 0 0 | |
| 1 | 0 0 1 | 1 |
| 2 | 0 1 1 | 2 |
| 3 | 0 1 0 | 1 |
| 4 | 1 1 0 | 3 |
| 5 | 1 1 1 | 1 |
| 6 | 1 0 1 | 2 |
| 7 | 1 0 0 | 1 |

Fig. 3

| Decimal numbers | Binary Gray code | Bit switch sequence |
|---|---|---|
| 0 | 0 0 0 | |
| 1 | 0 1 0 | 2 |
| 2 | 0 1 1 | 1 |
| 3 | 1 1 1 | 3 |
| 4 | 1 0 1 | 2 |
| 5 | 1 0 0 | 1 |

Fig. 4

| Decimal numbers | Binary Gray code | Bit switch sequence |
|---|---|---|
| 0 | 0 0 0 0 |  |
| 1 | 0 1 0 0 | 3 |
| 2 | 0 1 0 1 | 1 |
| 3 | 0 1 1 1 | 2 |
| 4 | 0 1 1 0 | 1 |
| 5 | 1 1 1 0 | 4 |
| 6 | 1 1 1 1 | 1 |
| 7 | 1 1 0 1 | 2 |
| 8 | 1 1 0 0 | 1 |
| 9 | 1 0 0 0 | 3 |
| 10 | 1 0 0 1 | 1 |

Fig. 5

METHOD FOR ESTABLISHING A GRAY CODE AND RELATED COUNTER CIRCUIT

BACKGROUND OF INVENTION

1. Field of the Invention

The present invention relates to a method for establishing a Gray code, and more specifically, to a method for establishing a Gray code count sequence capable of counting any number of elements and a counter circuit related to the method.

2. Description of the Prior Art

Binary counters are a common circuit element required in digital systems such as personal computers or programmable controllers. Generally speaking, a binary counter counts numbers in a binary manner (e.g. 0000->0001->0010->0011->0100-> . . . etc.). However, when a counter value switches to a next counter value, over one bit may need to change simultaneously. For instance, from 0001 to 0010, the least significant bit changes from 0 to 1 and the second least significant bit changes from 1 to 0. When multiple bits change simultaneously, a transient value such as 0011 may cause a glitch in the output of the binary counter so that a circuit using the output of the binary counter may not work normally.

In order to solve the problem mentioned above, a Gray code counter is used for counting. The Gray code counter counts numbers in a Gray code count sequence. Please refer to FIG. 1 showing a list of decimal numbers 0–15 listed in sequence and their corresponding four-bit binary Gray code values. Using the Gray code count sequence, only one bit changes when switching from a counter value to the next counter value, and the last code word returns to the first code word by only changing one bit. This is referred to as the property of Gray codes throughout the following description. In this manner, Gray codes solve the problem mentioned above. In FIG. 1, the bit switch sequence indicates which bit changes when switching from the current counter value to the next counter value. If this sequence is regarded as an ordered set, in any ordered sub-set of the set, there will be at least one number which appears an odd number of times. This is referred to as the property of the bit switching sequence throughout the following description.

However, conventional methods can only establish Gray code count sequences for $2^M$ elements, wherein M is the number of bits of each counter value, also referred to as a code word. A sequence for more than or less than $2^M$ elements but not having a glitch in output of the counter circuit is impossible in the prior art. In other words, when the last element returns to the first element, there is still over one bit that needs to be changed.

SUMMARY OF INVENTION

It is therefore a primary objective of the present invention to provide a method for establishing a Gray code count sequence capable of counting any number of elements and a counter circuit related to the method.

Briefly summarized, a method for establishing a Gray code count sequence is disclosed. The method for establishing a Gray code count sequence having N code words includes determining a first bit switch sequence having $2^M-1$ elements and the property of the bit switching sequence according to a first Gray code count sequence having $2^M$ code words, wherein $2^M$ is larger than N; determining a second bit switch sequence having N-1 elements and the property of the bit switching sequence according to the first bit switch sequence; and determining a second Gray code count sequence according to the second bit switch sequence.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 1 is a list of decimal numbers 0–15 and the corresponding four-bit binary Gray code count sequence.

FIG. 3 illustrates the first Gray code count sequence according to the first embodiment of the present invention.

FIG. 4 illustrates the second Gray code count sequence according to the first embodiment of the present invention.

FIG. 5 illustrates the third Gray code count sequence according to the second embodiment of the present invention.

DETAILED DESCRIPTION

Figure 2:
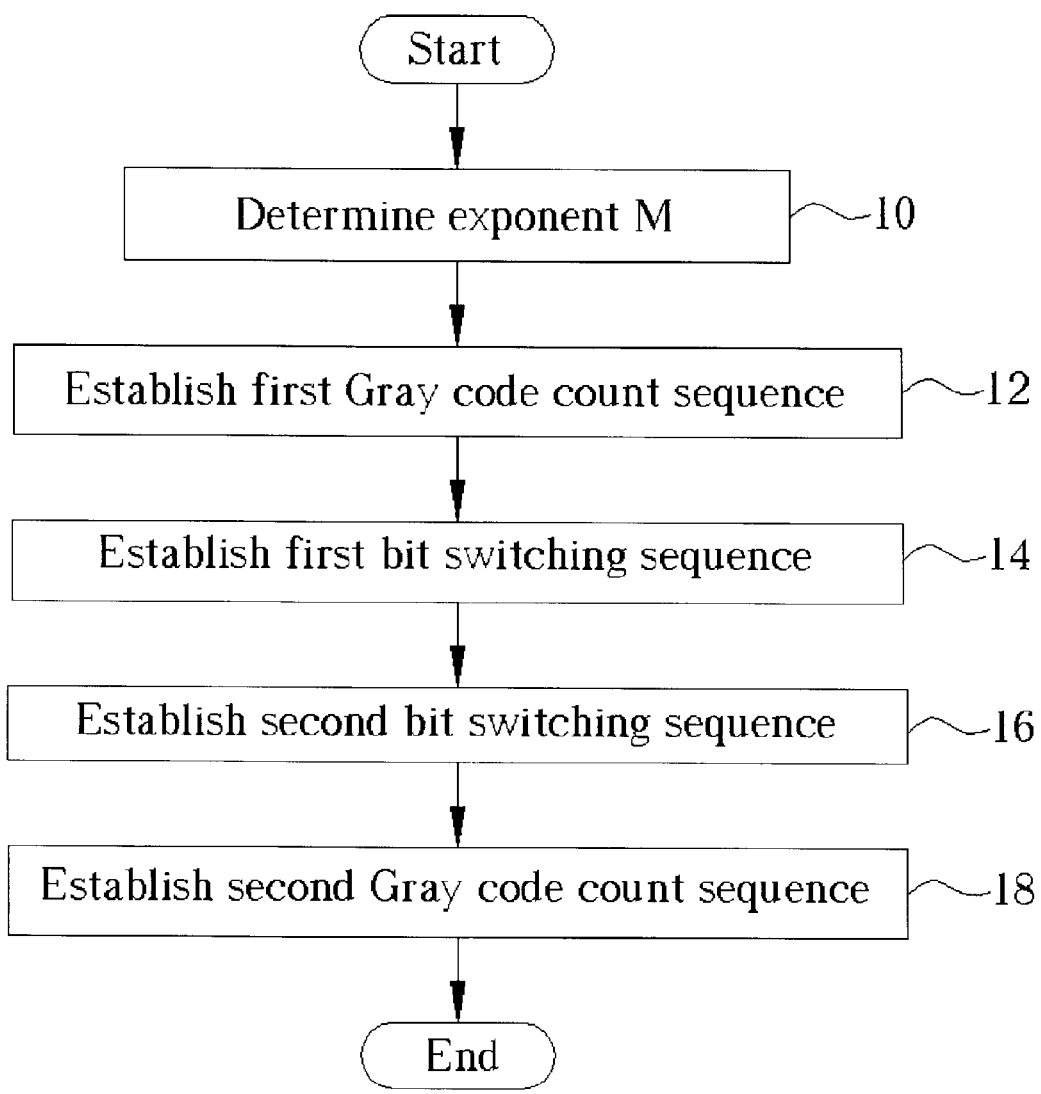
FIG. 2 is a flowchart of a method to establish a Gray code count sequence according to the present invention.

Please refer to FIG. 2 showing a flowchart of a method to establish a Gray code count sequence according to the present invention. The present invention provides a method to establish a Gray code count sequence having N elements and is described as follows:

Step 10: Determine an exponent M according to N, such that $2^M$ is the smallest integer that is larger than or equal to N.

Step 12: Establish a first Gray code count sequence having $2^M$ elements.

Step 14: Establish a first bit switch sequence having $2^M-1$ elements according to the first Gray code count sequence. Each value in the bit switch sequence indicates the bit changes when an element changes to the next element.

Step 16: Delete a proper number of elements from the first bit switch sequence to obtain a second bit switch sequence having N-1 elements.

Step 18: Establish a second Gray code count sequence having N elements according to the second switch sequence.

As an example, consider establishing a Gray code count sequence having 6 elements. First, since N=6 define M=3. In other words, it is required to establish a first 3-bit binary Gray code count sequence having $2^3=8$ elements, and establish a first bit switch sequence having 7 elements, as shown in FIG. 3.

Then, delete some numbers from the first bit switch sequence to obtain a second bit switch sequence. In this embodiment, since only 6 code words are needed, it is required to delete 2 elements from the first bit switch sequence. Here the elements to be deleted are of the same value. Furthermore, please notice that in the second bit switch sequence obtained after deleting the 2 elements, it is required to maintain the property that in any ordered sub-set of the sequence set, there is at least one number that appears an odd number of times. In case of the conventional Gray code bit switch sequence, there is a first element which is the middle number of the sequence and which can divide the whole sequence into a first ordered sub-set and a second ordered sub-set which are the same. Take the first bit switch sequence {1, 2, 1, 3, 1, 2, 1} in FIG. 3 as an example. The fourth element "3" is the middle number, by which the whole sequence is divided into two ordered sub-sets {1, 2, 1} which are the same. In the case of this embodiment, if the number of elements to be deleted is even, delete the same element in the same position and the same number from the first ordered sub-set and the second ordered sub-set respectively. From FIG. 3, 2 elements are needed to be deleted, thus the first element "1" of the first ordered sub-set {1, 2, 1} and the first element "1" of the second ordered sub-set {1, 2, 1} are deleted. Please notice that, if element "2" were deleted, both the first ordered sub-set and the second ordered sub-set would have two elements "1" remaining. That does not comply with the bit switch sequence property, thus the deletion of element "2" is not allowed. The second bit switch sequence after deleting the two elements "1" is shown in FIG. 4. Selecting elements to delete as above is only one of the embodiments of the present invention, any method that makes the second bit switch sequence comply with the bit switch sequence property also belongs to the present invention. E.g. delete mirrored symmetrical elements such as deleting the first element "1" of the first ordered subset and the last element "1" of the second ordered subset.

In Step 18, generate a 3-bit binary second Gray code count sequence having 6 elements according to the second bit switch sequence as shown in FIG. 4. For example, the first number of the second bit switch sequence is 2, which means to toggle the second bit of the first element 000 in the second Gray code count sequence to obtain the second element 010. As shown in FIG. 4, the second bit switch sequence also complies with the bit switch sequence property mentioned above, so that the probability of glitches is reduced to the minimum.

Please refer to FIG. 5 showing the second embodiment of the present invention. In the case of establishing a Gray code count sequence having 11 elements, proceed through Step 10, Step 12, and Step 14 as mentioned in the first embodiment. As the relating details are the same to that of the first embodiment, a further description is hereby omitted. A first bit switch sequence obtained after finishing Step 14 is shown in FIG. 1.

In this embodiment, it is required to delete 5 elements from the first bit switch sequence to form a second bit switch sequence. In the case that the number of elements to be deleted is odd, e.g. 5, firstly delete 4 elements from the first bit switch sequence in the same manner as in the first embodiment. Then delete one more element to obtain the second bit switch sequence. Please notice that in the second embodiment, when selecting elements whose number is even (in the same manner as in the first embodiment), the first element "1" of the first ordered subset and the last element "1" of the second ordered subset are first deleted. Additionally, when selecting the remaining element to be deleted, it is still required to have the second bit switch sequence comply with the bit switch sequence property. For example, firstly delete the first and the second element {1, 2} of a first ordered sub-set {1, 2, 1, 3, 1, 2, 1}, and the last two elements {2, 1} from a second ordered sub-set {1, 2, 1, 3, 1, 2, 1}. These two ordered sub-sets are divided by the element "4" being the middle number of the sequence. Then delete the third element "1" of the first ordered sub-set to obtain the second bit switch sequence shown in FIG. 5.

By establishing the second Gray code count sequence in FIG. 5 according to the second bit switch sequence, the goal of being required to toggle only one bit per each increment can be achieved. However, in the second Gray code count sequence, two bits are changed when the last element 1001 returns to the first element 0000, thus when the last element 1001 returns to the first element 0000, the possible transient values are 1000 and 0001. In the first bit switch sequence an even plurality of elements are deleted, specifically, the first element of the first ordered sub-set and the last element of the second ordered sub-set are deleted. Thus the second Gray code count sequence does not include 1000 and 0001 so that a glitch cannot occur.

Figure 6:
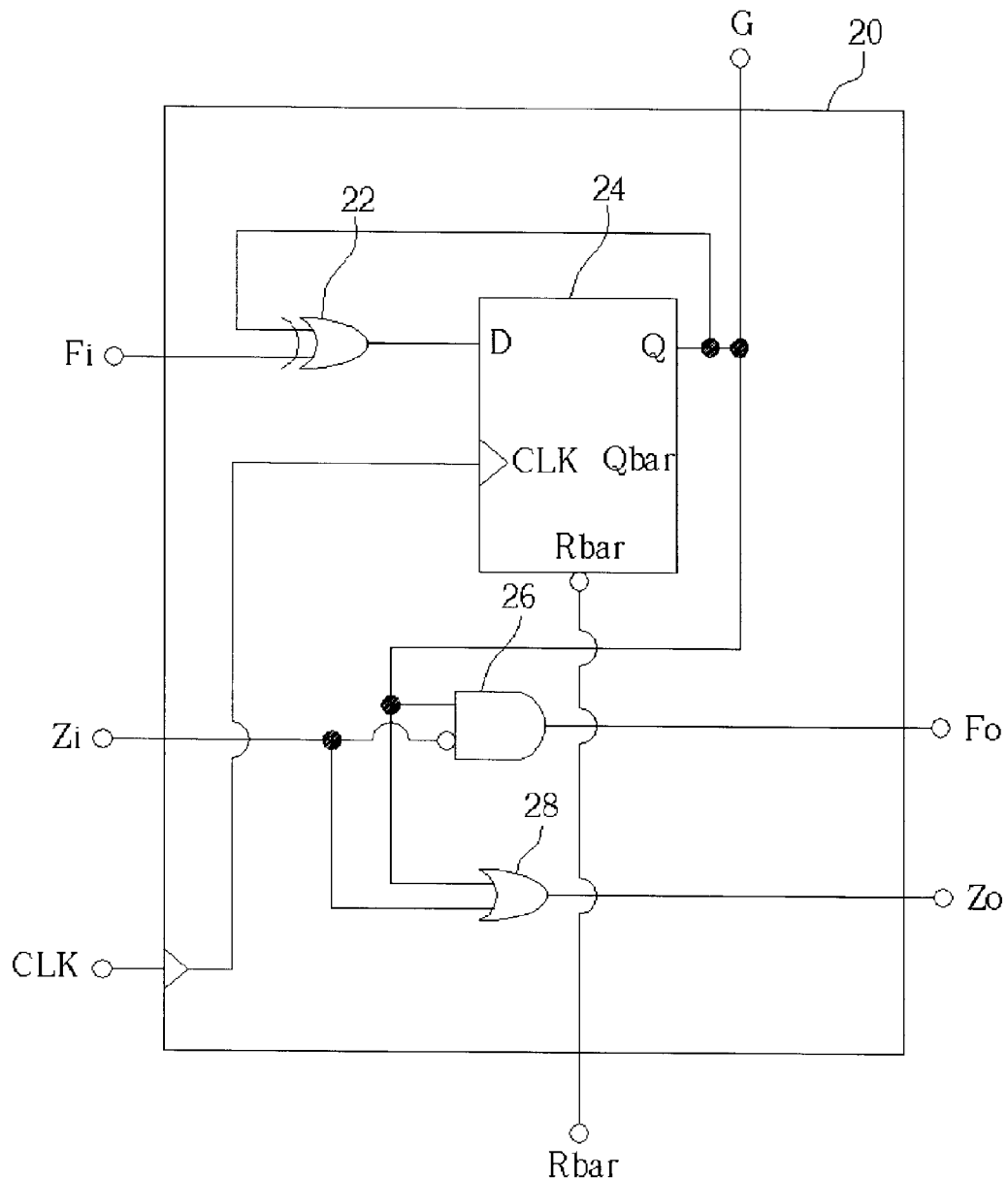
FIG. 6 is a circuit diagram of a first bit unit in a counter according to the present invention.
Figure 7:
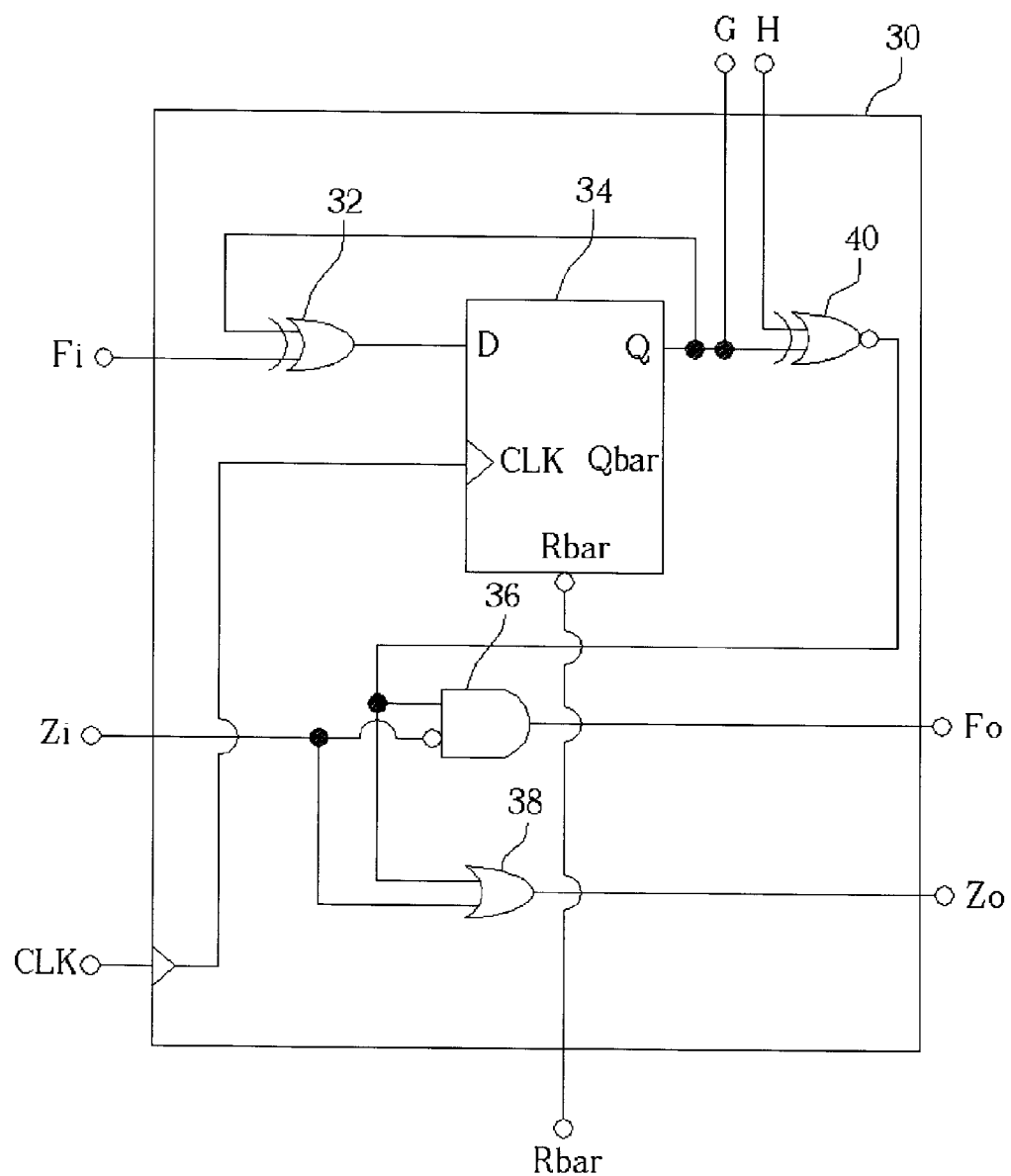
FIG. 7 is a circuit diagram of a second bit unit in a counter according to the present invention.

Please refer to FIG. 6 showing a circuit diagram of a first bit unit 20 in a counter applying the Gray code count sequence according to the present invention, and to FIG. 7 showing a second bit unit 30 in the counter. The first bit unit 20 in FIG. 6 includes a first input Fi, a second input Zi, a clock input Clock, a reset input Rbar, a first output Fo, a second output Zo, and a bit output G. The first bit unit 20 further includes an XOR logic gate 22, a D flip flop 24, an AND logic gate 26, and an OR logic gate 28. The D flip flop 24 is reset to an output signal of 0 according to an active low reset input Rbar. Additionally, one of the input ends of the AND logic gate 26 is inverted. The interconnection between these devices is shown in FIG. 6.

The difference between the second bit unit 30 in FIG. 7 and the first bit unit 20 in FIG. 6 is that the second bit unit 30 has a feedback input H, which is coupled with an input Q of the D flip flop via an XOR logic gate 40. The output signals of the XOR logic gate 40 are transmitted to an AND logic gate 36 and an OR logic gate 38 respectively.

Figure 8:
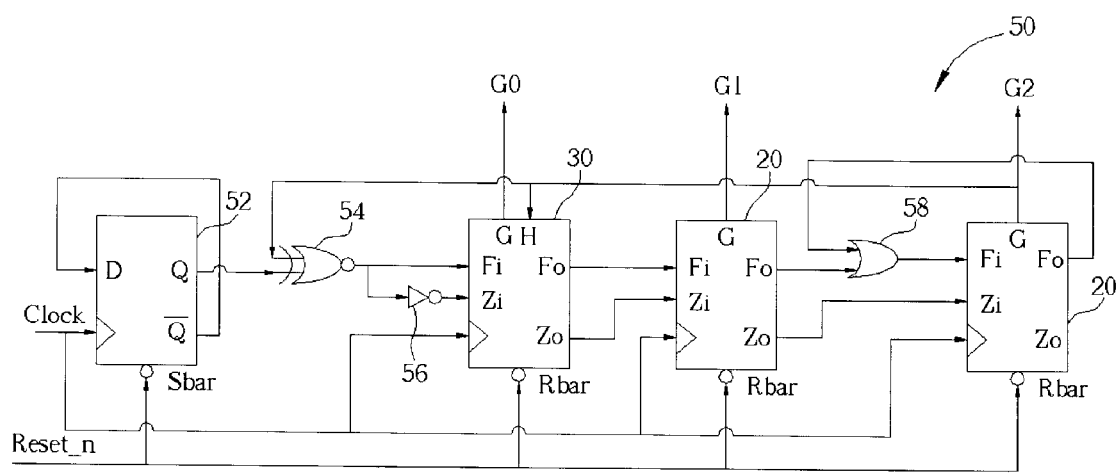
FIG. 8 is a circuit diagram of a Gray code counter formed using the first bit unit in FIG. 6 and the second bit unit in FIG. 7.

Please refer to FIG. 8 showing a circuit diagram of a Gray code counter formed using the first bit unit 20 in FIG. 6 and the second bit unit 30 in FIG. 7 according to the present invention. The counter 50 has three output signals (G2, G1, G0) representing three bits of the second Gray code count sequence respectively. When establishing the second bit switch sequence, element "1" is deleted an odd number of times (e.g. once) in the first ordered sub-set and the second ordered sub-set respectively, thus the second bit unit 30 is used to output the first bit G0. Other elements such as "2" and "3" in the first ordered sub-set and the second ordered sub-set are not deleted, or are deleted an even number of times. Thus the first bit unit 20 is used to output the second and the third bit. The Gray code counter according to the present invention is composed of a plurality of first bit units 20 and a plurality of second bit units 30 connected serially.

Those skilled in the art will readily observe that numerous modification and alterations of the method and device may be made while retaining the teachings of the invention. Accordingly, the above disclosure should be construed as limited only by the metes and bounds of the appended claims.

What is claimed is:

1. A Gray code counter for outputting a code word comprising:
 a plurality of bit counts coupled serially, at least one bit unit comprising:
  an XOR gate for receiving a first input signal;
  an AND gate for receiving a reverse second input signal and outputting a first output signal;
  an OR gate for receiving a second input signal and outputting a second output signal; and
  a flip flop having a signal input coupled with an output of the XOR gate, and a signal output coupled respectively with inputs of the XOR gate, the AND gate and the OR gate for outputting a bit output signal according to a clock signal, wherein the code word comprises the bit output signal.

2. The Gray code counter of claim 1, wherein at least one of the bit units further comprises:

an XNOR gate having a first input coupled to the signal output of the flip flop for receiving the bit output signal, a second input for receiving a third input signal, and an output coupled to input ends of the AND gate and the OR gate.

3. A method for generating a Gray code sequence having N code words comprising:

determining an exponent number M, wherein $2^M > N$;

generating a full length Gray code sequence having $2^M$ code words;

generating a first bit switch sequence having $2^M - 1$ element, wherein each element of the first bit switch sequence represents the difference between one of the code words and an adjacent code word of the full length Gray code sequence;

deleting $2^M - N$ elements of the first bit switch sequence according to a bit switching sequence property to generate a second bit switch sequence having N−1 elements; and generating the Gray code sequence having N code words according to the second bit switch sequence, wherein each element of the second bit switch sequence represents the difference between one of the code words and an adjacent code word of the Gray code, wherein the bit switching sequence property indicates that there is at least one element that appears an odd number of times in the bit switch sequence.

4. The method of claim 3, wherein the full length Gray code sequence further comprises a first half and a second half, wherein the first half and the second half are mirror images of one another with the exception of the most significant bits of the code words.

5. The method of claim 4, wherein the first bit switch sequence further comprises a middle element, and the first bit switch sequence is divided into a first ordered sub-set and a second ordered sub-set by the middle element, wherein the first ordered sub-set and the second ordered sub-set are the same size.

6. The method of claim 5, wherein if $2^M - N$ is an even number, the second bit switch sequence is generated by deleting $(2^M - N)/2$ element(s) from the first ordered sub-set and $(2^M - N)/2$ element(s) from the second ordered sub-set of the first bit switch sequence, wherein the position of the deleted element(s) in the first ordered sub-set corresponds to the position of the deleted element(s) in the second ordered sub-set.

7. The method of claim 6, wherein the value of each deleted element of the first ordered sub-set is the same as the value of the corresponding deleted element of the second ordered sub-set.

8. The method of claim 6, wherein the position of each deleted element of the first ordered sub-set is the same as the position of the corresponding deleted element of the second ordered sub-set.

9. The method of claim 6, wherein the position of each deleted element of the first ordered sub-set is the mirror image of the position of the corresponding deleted element of the second ordered sub-set.

10. The method of claim 5, wherein if $2^M - N$ is an odd number, the second bit switch sequence is generated by deleting $(2^M - N - 1)/2$ first element(s) from the first ordered sub-set and $(2^M - N - 1)/2$ second element(s) from the second ordered sub-set of the first bit switch sequence, wherein the position of the deleted element(s) in the first ordered sub-set corresponds to the position of the deleted element(s) in the second ordered sub-set, and then deleting one more element from the remaining elements of the first bit switch sequence.

11. The method of claim 10, wherein the value of each first deleted element of the first ordered sub-set is the same as the value of the corresponding second deleted element of the second ordered sub-set.

12. The method of claim 10, wherein the position of each first deleted element of the first ordered sub-set is the same as the position of the corresponding second deleted element of the second ordered sub-set.

13. The method of claim 10, wherein the position of each first deleted element of the first ordered sub-set is the mirror image of the position of the corresponding end deleted element of the second ordered sub-set.

14. A method for generating a Gray code sequence having N code words comprising:

determining an exponent number M, wherein $2^M > N$;

generating a first bit switch sequence having $2^M - 1$ elements according to a bit switching sequence property, wherein the value of each element of the first bit switch sequence is an integer number ranging from 1 to M;

deleting $2^M - N$ element of the first bit switch sequence according to the bit switching sequence property to produce a second bit switch sequence; and generating the Gray code sequence having N code words according to the second bit switch sequence, wherein each element of the second bit switch sequence represents the difference between one of the code words and an adjacent code word of the Gray code sequence;

wherein the bit switching sequence property indicates that there is at least one element that appears an odd number of times in the bit switch sequence.

15. The method of claim 14, wherein the first bit switch sequence further comprises a middle element, and the first bit switch sequence is divided into a first ordered sub-set and a second ordered sub-set by the middle element, wherein the first ordered sub-set and the second ordered sub-set are the same size.

16. The method of claim 15, wherein if $2^M - N$ is an even number, the second bit switch sequence is generated by deleting $(2^M - N)/2$ element(s) from the first ordered sub-set and $(2^M - N)/2$ element(s) from the second ordered sub-set of the first bit switch sequence, wherein the position of the deleted element(s) in the first ordered sub-set corresponds to the position of the deleted element(s) in the second ordered sub-set.

17. The method of claim 16, wherein the value of each deleted element of the first ordered sub-set is the same as the value of the corresponding deleted element of the second ordered sub-set.

18. The method of claim 16, wherein the position of each deleted element of the first ordered sub-set is the same as the position of the corresponding deleted element of the second ordered sub-set.

19. The method of claim 16, wherein the position of each deleted element of the first ordered sub-set is the mirror image of the position of the corresponding deleted element of the second ordered sub-set.

20. The method of claim 15, wherein if $2^M - N$ is an odd number, the second bit switch sequence is generated by deleting $(2^M - N - 1)/2$ first element(s) from the first ordered sub-set and $(2^M - N - 1)/2$ second element(s) from the second ordered sub-set of the first bit switch sequence, wherein the position of the deleted element(s) in the first ordered sub-set corresponds to the position of the deleted element(s) in the second ordered sub-set, and then deleting one more element from the remaining elements of the first bit switch sequence.

* * * * *